United States Patent
Kotani et al.

(10) Patent No.: US 7,614,026 B2
(45) Date of Patent: Nov. 3, 2009

(54) PATTERN FORMING METHOD, COMPUTER PROGRAM THEREOF, AND SEMICONDUCTOR DEVICE MANUFACTURING METHOD USING THE COMPUTER PROGRAM

(75) Inventors: Toshiya Kotani, Machida (JP); Hirotaka Ichikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 399 days.

(21) Appl. No.: 11/521,440

(22) Filed: Sep. 15, 2006

(65) Prior Publication Data

US 2007/0066025 A1 Mar. 22, 2007

(30) Foreign Application Priority Data

Sep. 16, 2005 (JP) ............................. 2005-271098

(51) Int. Cl.
*G06F 17/50* (2006.01)
(52) U.S. Cl. ............................. 716/11; 716/19; 716/21
(58) Field of Classification Search .................. 716/1–2, 716/7–11, 19–21; 430/5, 22, 30; 382/144, 382/149
See application file for complete search history.

(56) References Cited

U.S. PATENT DOCUMENTS

| 6,374,396 | B1 | 4/2002 | Baggenstoss et al. |
| 6,706,456 | B2 | 3/2004 | Miyashita et al. |
| 2003/0005390 | A1* | 1/2003 | Takashima et al. ............. 716/1 |
| 2003/0088839 | A1* | 5/2003 | Watanabe ....................... 716/7 |
| 2006/0143589 | A1* | 6/2006 | Horng et al. ................... 716/19 |
| 2006/0245636 | A1* | 11/2006 | Kitamura et al. ............ 382/149 |

FOREIGN PATENT DOCUMENTS

| JP | 2005-24903 | 1/2005 |
| TW | 459348 | 10/2001 |
| TW | 490591 | 6/2002 |

OTHER PUBLICATIONS

Notice of Examination Opinion dated Jul. 15, 2009, from the Taiwanese Patent Office in Taiwan Application No. 095132752, and English-language translation of same.

* cited by examiner

*Primary Examiner*—Paul Dinh
(74) *Attorney, Agent, or Firm*—Finnegan, Henderson, Farabow, Garrett & Dunner, L.L.P.

(57) ABSTRACT

A pattern of a desired size is formed on a semiconductor substrate by the following procedure. A property, including at least one of an aberration of an exposure device, a property of an illumination, a property of a projection lens, and a pattern coverage in a shot, are allocated, in a first database, to predetermined positions assigned in a chip. A second database is prepared by pairing a cell name of a cell extracted from hierarchical processing of a design pattern and arrangement positional data of the cell. The property data is allocated to the cell based on the first and second databases. Mask data processing based on at least one of the property data is executed, and the cell subjected to the mask data processing is rearranged on the chip.

20 Claims, 5 Drawing Sheets

PATTERN FORMING METHOD, COMPUTER PROGRAM THEREOF, AND SEMICONDUCTOR DEVICE MANUFACTURING METHOD USING THE COMPUTER PROGRAM

CROSS-REFERENCE TO RELATED APPLICATIONS

This application is based upon and claims the benefit of priority from prior Japanese Patent Application No. 2005-271098, filed Sep. 16, 2005, the entire contents of which are incorporated herein by reference.

BACKGROUND OF THE INVENTION

1. Field of the Invention

The present invention relates to a mask pattern forming method for use in the manufacture of semiconductor devices or the like, and more particularly to a pattern forming method capable of shortening a processing time, suppressing increase in data size and forming a micropattern, its program, and a semiconductor device manufacturing method which uses the program.

2. Description of the Related Art

Recent progress in semiconductor manufacturing technology has been very conspicuous, and semiconductors of a minimum processing size of 0.13 μm are now mass-produced. Such micronization has been realized by rapid progress of micropattern forming technology such as mask processing technology, lithography processing technology, and etching processing technology. In the era of sufficiently large pattern sizes, a mask pattern of the same shape as that of the pattern drawn by a designer was formed, and this mask pattern was transferred to a resist applied on a wafer by an exposing device, thereby enabling formation of a pattern as designed.

However, as the micronized pattern size has caused increase in the influence of diffraction of exposure light on a size on the wafer and a difficulty of a mask and wafer processing technology for accurately forming the micropattern, it is now difficult to form a pattern on the wafer as designed even when the same mask as that of a design pattern is used.

To improve fidelity of the design pattern, technologies called optical proximity correction (OPC) and process proximity correction (PPC) for forming a mask pattern to form a pattern identical to the design pattern on the wafer have been used.

The OPC and PPC technologies (referred to as PPC including the OPC, hereinafter) are largely classified into two methods. One is a method for defining a moving amount of an edge constituting the design pattern as a rule in accordance with a width of the design pattern, a most proximate distance between patterns, or the like, and moving the edge based on this rule (e.g., see Jpn. Pat. Appln. KOKAI Publication No. 2005-24903).

The other method is for setting an edge moving amount to be optimal so that a pattern identical to the design pattern can be formed on the wafer by using a lithography simulator capable of highly accurately predicting a diffracted light intensity distribution of diffracted light of the exposure light. Additionally, there has been proposed a correction method for realizing more accurate correction by combining these two methods.

As described above, micronization has brought about an essential necessity of much higher accuracy of OPC. Especially, a size fluctuation in an exposure shot which control of the exposure device or the process has been capable of suppressing to a predetermined size variance has become conspicuous. There is an urgent need not only to suppress such a fluctuation by making exposure device specifications more strict and a process control technology more accurate, but also to establish an OPC correction technology which reflects influences thereof. According to conventional OPC, correction can be made by presuming that the influences are all similar among shots. However, when the influences vary from shot to shot, it has been difficult to allocate different correction amounts to positions. Reasons are as follows.

First, in the case of OPC, areas having influences on a size of the pattern on the wafer are patterns alone present in several μm around the pattern. Thus, when pattern arrangements are completely identical within several μm, equal correction values are always allocated.

For this reason, a hierarchical structure originally owned by the design data can be effectively used. Even when identical layers (cells) are arranged in a plurality of shots, only by processing data of one cell, it is possible to obtain effects similar to those when data of the plurality of cells are processed, to greatly shorten a data processing time, and to suppress the amount of completed data small.

However, when the different correction values are allocated to the positions in the shots, the above effects cannot be obtained. In other words, as there is a need to allocate the different correction values in the shots, the hierarchy of the design data must be subject to roughly flat operation, greatly extending the data processing time and increasing the amount of data.

The above is especially conspicuous in a memory device (SRAM, DRAM, NAND, or NOR) having many repeated patterns. Obviously, there is a demand for establishment of a data processing method which uses a hierarchical structure of a design pattern as much as possible while allocating different correction values among shots to highly accurately correct a memory at high speed.

BRIEF SUMMARY OF THE INVENTION

According to a first aspect of the invention, there is provided a pattern forming method for forming a pattern of a desired size on a substrate of a semiconductor device, which includes:

preparing a first database by allocating property data to each position in a chip when the pattern is exposed;

preparing a second database by pairing a cell name of a cell extracted from hierarchical processing of a design pattern and arrangement positional data of the cell;

by allocating the property data to the cell based on the first database and the second database, executing mask data processing based on at least one of the property data; and rearranging on the chip the cell subjected to the mask data processing.

A second aspect of the invention, there is provided a computer program for pattern formation, the program being stored in a computer readable medium and including:

preparing a first database by allocating property data to each position in a chip when the pattern is exposed;

preparing a second database by pairing a cell name of a cell extracted from hierarchical processing of a design pattern and arrangement positional data of the cell;

by allocating the property data to the cell based on the first database and the second database, and executing mask data processing based on at least one of the property data; and rearranging on the chip the cell subjected to the mask data processing.

According to a third aspect of the invention, there is provided a semiconductor device manufacturing method, which includes:

preparing mask pattern data based on design pattern data, which includes:

preparing a first database by allocating property data to each position in a chip when the pattern is exposed;

preparing a second database by pairing a cell name of a cell extracted from hierarchical processing of a design pattern and arrangement positional data of the cell;

allocating property data to the cell based on the first database and the second database, and executing mask data processing based on at least one of the property data; and rearranging on the chip the cell subjected to the mask data processing;

preparing a mask based on the mask pattern data;

forming a predetermined film on a semiconductor wafer, followed by patterning the predetermined film through the mask by lithography to form wiring lines;

dicing the semiconductor wafer to form a plurality of chips;

mounting each of the plurality of chips on a predetermined package.

DETAILED DESCRIPTION OF THE INVENTION

Heretofore, it has been necessary to operate and process a hierarchical structure of design data, which has caused prolongation of a data processing time and increase in an output data size. However, according to the present embodiments, a hierarchy operation amount can be limited to a necessary minimum, and hence it is possible to shorten a processing time and to suppress the increase in the output data size.

Additionally, as property data is finely reflected in a cell, it is possible to realize highly accurate micropattern formation.

The embodiments of the present invention will be described below with reference to the accompanying drawings.

First Embodiment

Figure 6:
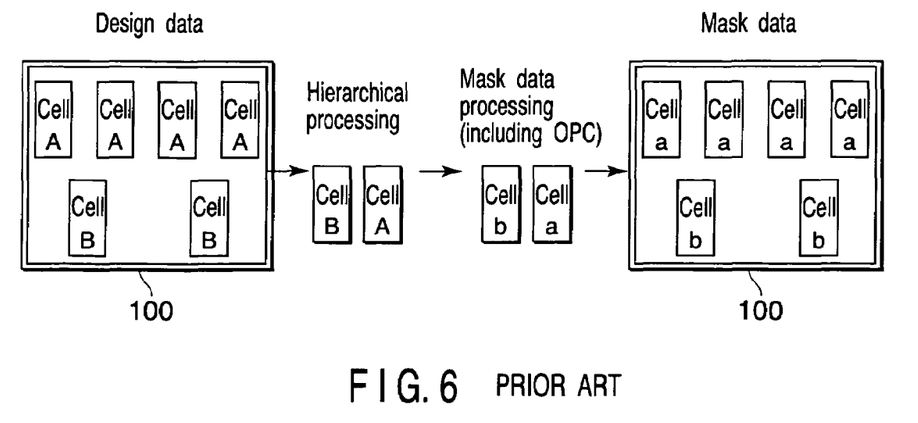
FIG. 6 is a schematic diagram showing a conventional mask data preparation method.

Before description of a first embodiment, a conventional pattern forming method will be described by referring to FIG. 6. Cells A and B are arranged on design data. The cells A, B represent cells processed during mask data processing, and another cell structure may be arranged below the cells A, B. During the mask data processing, a cell structure to be subjected to mask data processing is first extracted from the design data, and mask data processing is executed for cells to generate cells a, b different from the cells A, B. In this case, the mask data processing includes OPC processing, resizing processing, Boolean operation processing, and the like. The cells a, b are arranged by replacing the originally arranged cells A, B, and mask data is generated from the design data.

Thus, according to the conventional pattern forming method, the cell structure of the design data is properly extracted by hierarchical processing, whereby a mask processing amount can be reduced as much as possible. Particularly, this suppresses prolongation of a mask data processing time caused by OPC processing, and hence it is very useful. In the conventional method, however, the cell a is always allocated to the cell A arranged on the design data. In other words, in spite of an arrangement of the cell A in a different position of the design data, the same data processing result (same correction value in OPC processing) is allocated irrespective of the position.

With acceleration of pattern micronization, when a position of the design data or a pattern arranging position on the mask varies, a systematic variance in finished size on the wafer has begun to be conspicuous because of an influence of optical characteristics of the exposure device or a process variance. Such an influence has a distribution in one exposure shot. Accordingly, a variance amount must be defined for each shot position. Causes of the variance for each shot position are an aberration of the exposure device, an aberration of the projection lens, a transmittance of the projection lens, a polarization degree of illumination, coverage of patterns arranged in the shot, and the like. According to the conventional method, as different correction values must be allocated to the positions even when the cell structure is cut out considering these causes, mask data processing cannot be carried out by handling as the same cell, but all the cells must be operated. As a result, the amount of mask data processing increases, and the processing time is extended, and the mask data size increases.

Next, the first embodiment of the present invention will be described. In the first embodiment, causes of an exposure device variance and a process variance having distributions depending on positions are set as property (attribute information) of each position to prepare a database. Then, to each cell to be subjected to mask data processing, the property registered in the database is allocated based on arrangement positional data thereof. Hierarchical processing is carried out in which cells having matched cell names and property are subjected to mask data processing as one cell, while cells having matched cell names but different property are subjected to mask data processing as different cells.

Figure 1:
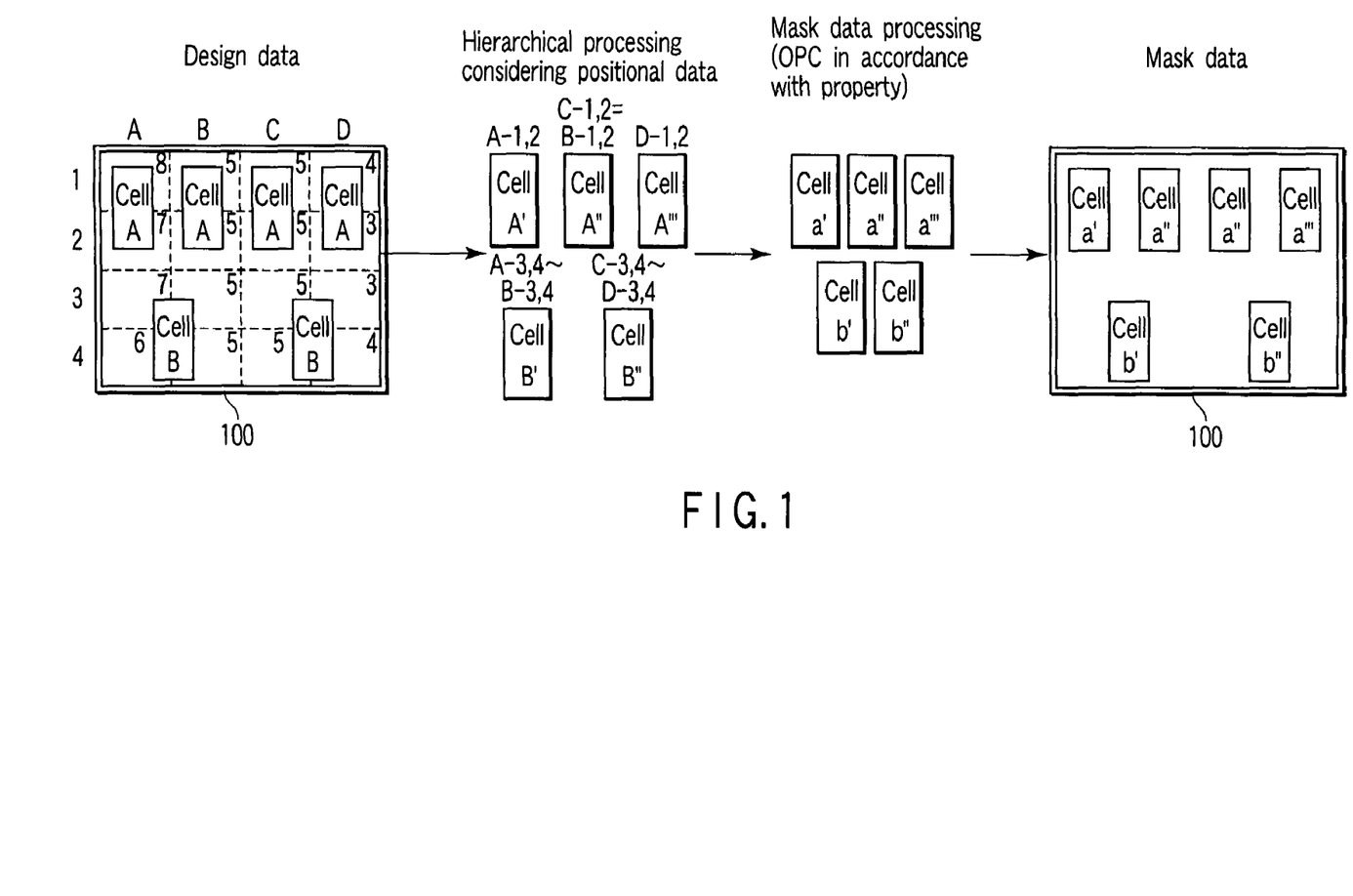
FIG. 1 is a schematic diagram showing a mask data preparation method according to a first embodiment of the present invention.

A specific example will be described by referring to a process schematic diagram of FIG. 1 and a flowchart of FIG. 2. Property is allocated to each mesh-divided area with respect to design data similar to that of the conventional method of FIG. 6. For example, the design data of the left end of FIG. 1 is divided into areas having addresses of horizontal positions A to D and vertical positions 1 to 4 in a meshed form. Cells A are formed in (A-1, 2), (B-1, 2), (C-1, 2), and (D-1, 2), and cells B are formed in (A-3, 4 to B-3, 4) and (C-3, 4 to D-3, 4). A size of this mesh depends on required OPC correction accuracy, and the mesh can be small or large. The form is not limited to the mesh, but property may be defined for a specific area. Positional data may be provided with predetermined tolerance. When positional data is uniquely decided, the number of cells in hierarchical processing may be increased, which may cause prolongation of the processing time. Accordingly, by providing a predetermined permission width to the positional data, the cells are permitted to belong to any positions, making it possible to limit the number of cells generated by the hierarchical processing. As a result, the processing time can be reduced. The design data is used to be identical to one shot during exposure.

The property is a parameter changed depending on an exposure position. For example, the property is data regarding an aberration of an exposure device, an illumination shape, illumination brightness, an aberration of a projection lens, a transmittance of the projection lens, a polarization degree of illumination, pattern coverage or the like. In FIG. 1, simple numerals 3 to 8 are used for each mesh, and each numeral indicates the above data. The property may be a file name defining an aberration, illumination conditions or the like, or defining coverage. Further, an area having no property may be present.

Figure 3:
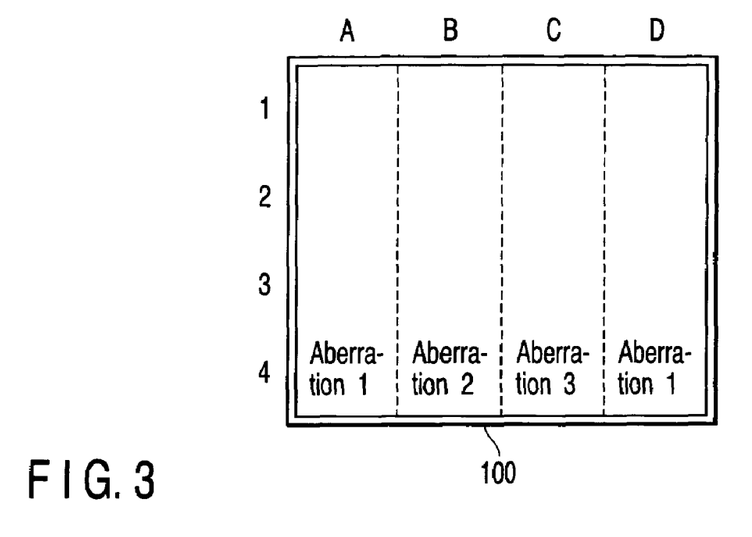
FIG. 3 is a schematic diagram showing an example of aberration data on a chip.
Figure 4:
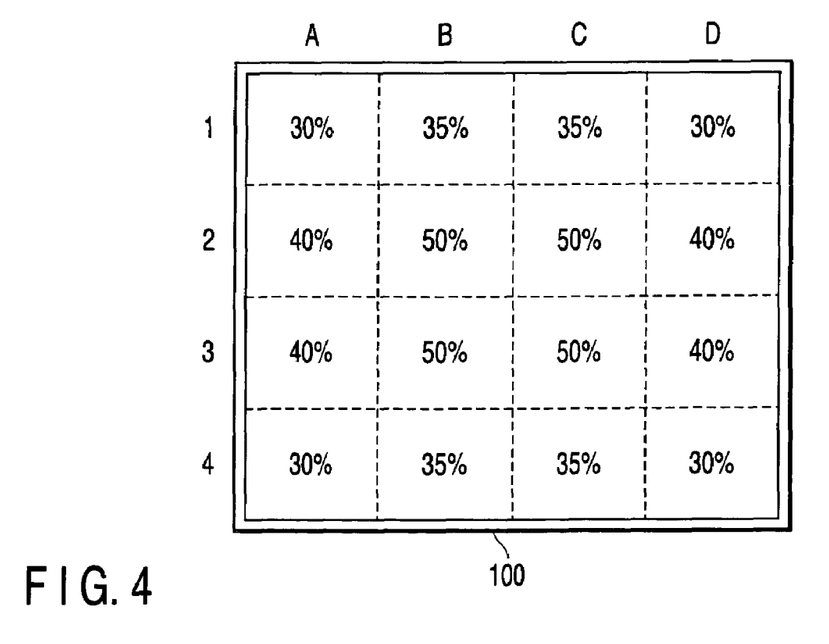
FIG. 4 is a schematic diagram showing an example of coverage data on the chip.

The property may be plural in which the above data are combined, or preparation of an area mesh may be different for each of the data. As an example, FIGS. 3 and 4 show a method for defining aberration data and pattern coverage data. In the case of the aberration of FIG. 3, aberrations 1 to 4 are allocated to (A-1, 2, 3, 4), (B-1, 2, 3, 4), (C-1, 2, 3, 4) and (D-1, 2, 3, 4). In the case of the coverage of FIG. 4, coverage unique to each mesh is allocated. Thus, a database 1 having property allocated depending on each position is prepared (S101 of FIG. 2).

Next, for the cells extracted from the hierarchical processing by the conventional method, arrangement positional data thereof are provided. It is only necessary to recognize areas of the design data in which the cells are arranged. In the example of FIG. 1, as a result of the hierarchical processing, a cell A' is allocated to (A-1, 2), cells A" are allocated to (B-1, 2) and (C-1, 2), and a cell A''' is allocated to (D-1, 2). Similarly, a cell B' is allocated to (A-3, 4 to B-3, 4), and a cell B" is allocated to (C-3, 4 to D-3, 4). Accordingly, a database 2 is prepared by pairing a cell name and its arranging area (S102 of FIG. 2).

Next, area property data is obtained from the database 1, an area cell name is obtained from the database 2, and property data is allocated to each cell. When there are a plurality of databases equivalent to the database 1 (e.g., aberration data and illumination shape data), property data allocated to the cells are plural.

Accordingly, cell data containing the property is completed. The cells in which property data and cells are matched are subjected to mask data processing as one cell. On the other hand, the cells in which cells are matched but property data are different are subjected to mask data processing as different cells. Thus, it is possible to carry out mask data processing reflecting property varied from position to position (S103 of FIG. 2). In the example of FIG. 1, the cells A', A" and A''', and the cells B', B" and B''' are subjected to OPC processing according to property to become cells a', a", a''', b' and b". For the OPC processing in this case, optical simulation considering the above property may be arranged, or a pattern resizing amount may be changed according to property.

Figure 2:
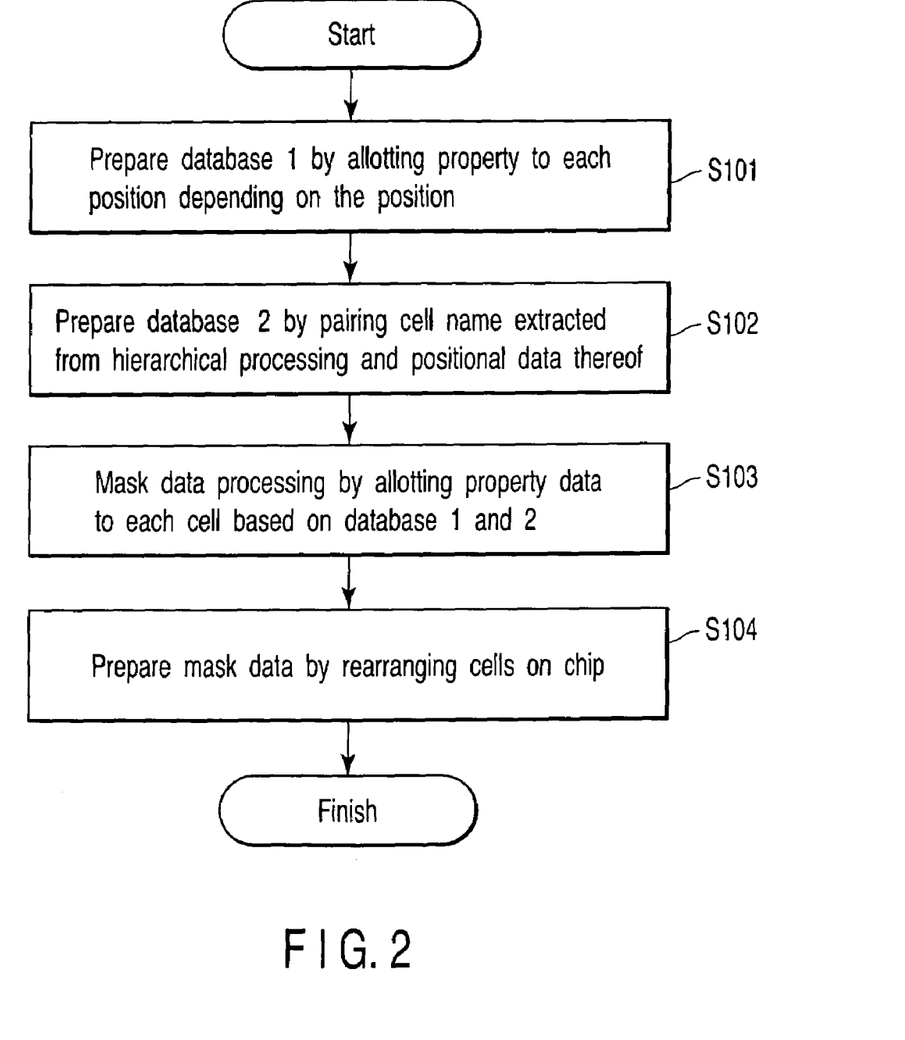
FIG. 2 is a process flowchart of the first embodiment of the present invention.

The cells subjected to the OPC processing are rearranged on the chip to prepare mask data actually used for manufacturing (S04 of FIG. 2).

Thus, according to the embodiment, when the correction value of the OPC processing is changed because of a variance in aberration, illumination shape or the like, or when a variance in pattern coverage causes a change in etching process exchange difference making it necessary to change mask pattern correction, it is possible to carry out mask data processing of a data processing amount limited to a minimum without operating the cells as much as possible.

Second Embodiment

The first embodiment has shown the case in which the cells are handled as different cells when the property is different. However, whether it is actually necessary to handle the cells separately depends on a need to set different cells based on given property.

That is, even if property 1 and property 2 are different from each other, there may be no influence of the difference at all on the mask data processing. For example, in the case of aberrations, there are an aberration having an influence only on a pattern long in an up-and-down direction, an aberration having an influence on a pattern long in a left-and-right direction, and an aberration exerting an influence depending on a direction of a pattern.

If there is a pattern of an up-and-down direction only in the cell, and there is a difference in an aberration only of no influence in the up-and-down direction in the aberration property, there may be substantially no influence at all on a mask pattern shape after the OPC processing even if the property is different. Accordingly, it is not always necessary to handle the cells separately even if the property is different.

Thus, whether to handle the cells different in property as separate cells must be determined based on matching of OPC correction values output through the lithography simulator (optical calculation tool) in the above aberration case. If the OPC correction values are matched while the property is different, it is possible to maintain the cell structure by handling the cells as the same cells.

Figure 5:
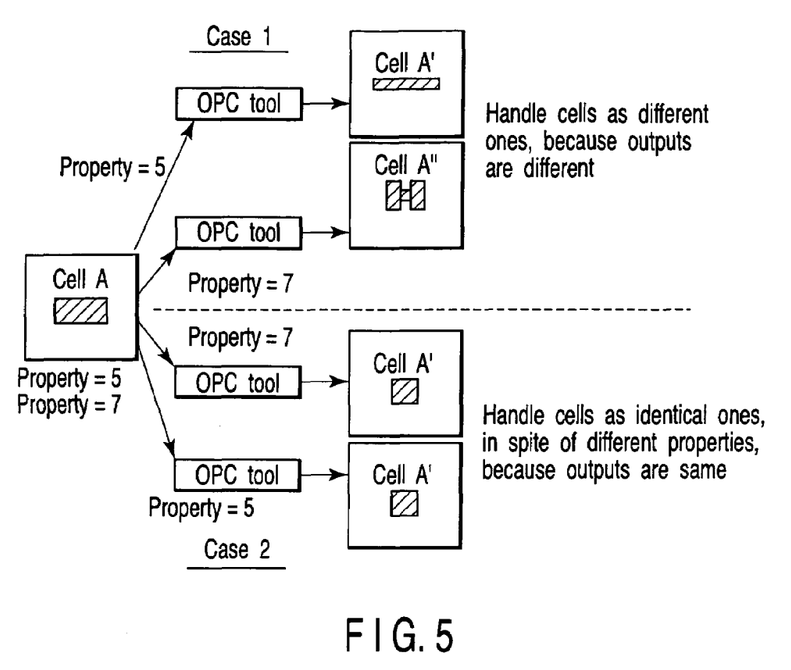
FIG. 5 is a schematic diagram showing a mask data preparation method according to a second embodiment of the present invention.

A specific method will be described by referring to FIG. 5. In FIG. 5, two upper and lower cases are presumed. First, two different properties (=5, 7) are allocated to input cells. In the upper case, property data is input together with cell pattern information to an OPC tool. The OPC tool is presumed to include a lithography simulator which decides a correction value for a pattern. In the upper case, since different correction values are obtained as a result of calculating correction values based on different properties, the cells A must be handled as different cells A', A".

In the lower case, as described above, in the case in which the properties are different but have no impact on the correction values, pattern shapes output from the OPC tool are matched with one another. Accordingly, it is possible to handle the output pattern shapes as the same cell. Through a step of determining whether it is permitted to regard correction values as equal correction values because of a very small difference thereof while properties are different, even if the cells must normally be handled as different, it is permitted to handle the cells as the same cell.

Thus, by evaluating the correction values output from the OPC tool or identify of the correction values, it is possible to determine whether the cells can be handled as the same cell even if the properties are different, increasing a data amount reduction effect. Moreover, as it is not necessary to operate the cells before the OPC step, it is possible to execute OPC of position dependence under a processing load roughly equal to the mask data processing amount in the hierarchical processing of the conventional method.

The second embodiment has been described by way of the case in which when the correction values output from the OPC tool are matched even if the properties of the cells are different, the cells are handled as the same cell, and handled as different cells only when the correction values are different. When the property is coverage data, the areas thereof may be indiscriminatedly resized depending on the coverage data. In such a case, as in the case of the second embodiment, the cells can be handled as the same cell if resizing amounts are equal, and handled as separate cells only when the resizing amounts are different.

Third Embodiment

The property can be linked with process data used at a plant. In other words, as long as a processing procedure is predetermined, it is possible to prepare a design layout considering data during mask preparation of exposure device aberration data or illumination data in a shot in the process data or a lithographic verification flow to prevent a layout pattern for a pattern of a small margin by lithography carried out in a design flow.

However, even in the case of the lithography verification flow during design pattern building, data such as an aberration, an illumination shape, or pattern coverage cannot be decided before arrangement data on the mask is decided. Thus, it is useful to correct or prepare a design layout considering aberration data and illumination data during lithography verification after establishment of a mask image (floor plan) carried out after the end of placement and routing (P & R) wiring.

Apparently, the flow of defining the property which exerts an influence on the wafer shape for each position, executing lithography simulation considering the property, determining whether a lithography margin on the design pattern is enough, and correcting the design pattern when the margin is not enough is very useful when a design pattern robust against the process is prepared.

Figure 7:
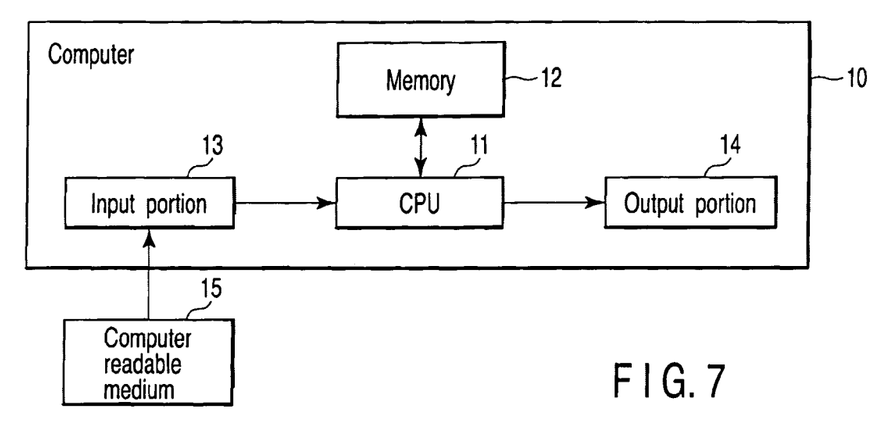
FIG. 7 is a system diagram when a pattern forming method of the present invention is used.

The procedure of the embodiment can be executed by a computer system 10 shown in FIG. 7. The computer system 10 includes a CPU 11, a memory 12, input/output portions 13, 14. The procedure is written as a program to a recoding medium 15 such as an optical disk like a magnetic disk, CD, DVD, or MO, or a semiconductor memory to be read by the computer system. Such a computer system can be incorporated into various devices or applied to various devices through program transmission from a communication medium.

Figure 8:
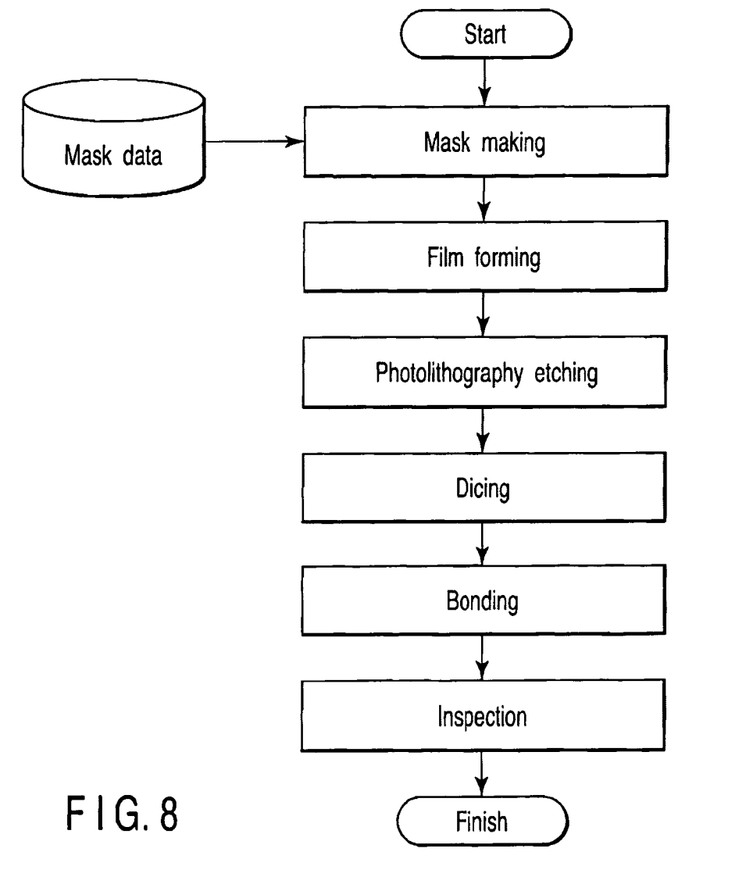
FIG. 8 is a flowchart showing a method for manufacturing a semiconductor device based on the mask data prepared by using the pattern forming method of the present invention.

By transferring the mask pattern described above through the first to third embodiments to the semiconductor substrate, it is possible to obtain a wafer formed on a surface highly accurately within a range of permissible errors in accordance with a size, a shape and an arrangement set at a designing stage, and a semiconductor device can be manufactured by using this wafer. In other words, as shown in a flowchart of FIG. 8, a mask is formed, and a predetermined film is formed on the semiconductor wafer, and the wafer is patterned by using lithography. After repeating this step necessary times, dicing is carried out to separate the wafer into a plurality of chips. Each chip is die-bonded to a predetermined package, and terminals of the package and wiring lines (pads) on the chip are connected to each other, thereby manufacturing a semiconductor device.

The present invention has been described in accordance with the embodiments, but other embodiments of the invention are as follows.

(1) The property data contains at least one of an aberration of an exposure device, an illumination shape, an illumination brightness, an aberration of a projection lens, a transmittance of the projection lens, a polarization degree of illumination, and a pattern coverage in a shot.

(2) The pattern forming method further comprises a step of calculating a finished plane shape on the semiconductor substrate which is predicted from the mask data processing, and correcting the design pattern based on a result thereof.

(3) The mask data processing includes at least resizing processing.

(4) The mask data processing includes optical proximity correction processing which uses at least a lithography simulator.

(5) The property data with property contains a plurality of property data for a pattern to be processed.

(6) The property data is defined for each divided area of the chip.

(7) If output values from the lithography simulator are the same, cells are handled as the same cells, even when properties are different.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method for forming a pattern of a desired size on a substrate of a semiconductor device, comprising:
   preparing a first database by allocating property data to predetermined positions assigned in a chip;
   storing, by a processor, data regarding the allocating in the first database in a memory;
   preparing a second database by pairing a cell name of a cell extracted from hierarchical processing of design pattern data and arrangement positional data of the cell;
   storing, by the processor, data regarding the pairing in the second database in the memory;
   allocating the property data to the cell based on the first database and the second database, and executing mask data processing based on at least one of the property data, to prepare for a rearrangement of the cell; and
   rearranging on the chip the cell subjected to the mask data processing,
   wherein the property data contains at least one selected from the group consisting of an aberration of an exposure device, a property of an illumination, a property of a projection lens, and a pattern coverage in a shot.

2. The method according to claim 1, wherein the property data further contains at least one selected from the group consisting of an illumination shape, an illumination brightness, an aberration of a projection lens, a transmittance of the projection lens, and a polarization degree of illumination.

3. The method according to claim 1, further comprising calculating a finished plane shape on the semiconductor substrate which is predicted from the mask data processing, and correcting the design pattern data based on a result of said calculating.

4. The method according to claim 1, wherein said executing the mask data processing includes resizing processing.

5. The method according to claim 1, wherein said executing the mask data processing includes optical proximity correction.

6. The method according to claim 1, wherein the property data contains a plurality of property data for a pattern to be processed.

7. The method according to claim 1, wherein the property data is defined for each divided area of the chip.

8. A computer program for pattern formation, the program being stored in a computer readable medium, the program which when executed by a processor will perform a process comprising:

preparing a first database by allocating property data to predetermined positions assigned in a chip;

storing data regarding the allocating in the first database in a memory;

preparing a second database by pairing a cell name of a cell extracted from hierarchical processing of design pattern data and arrangement positional data of the cell;

storing data regarding the pairing in the second database in the memory;

allocating the property data to the cell based on the first database and the second database, and executing mask data processing based on at least one of the property data, to prepare for a rearrangement of the cell; and rearranging on the chip the cell subjected to the mask data processing, wherein the property data contains at least one selected from the group consisting of an aberration of an exposure device, a property of an illumination, a property of a projection lens, and a pattern coverage in a shot.

9. The computer program according to claim 8, wherein the property data further contains at least one selected from the group consisting of an illumination shape, an illumination brightness, an aberration of a projection lens, a transmittance of the projection lens, and a polarization degree of illumination.

10. The computer program according to claim 8, further comprising calculating a finished plane shape on the semiconductor substrate which is predicted from the mask data processing, and correcting the design pattern based on a result of said calculating.

11. The computer program according to claim 8, wherein said executing the mask data processing includes resizing processing.

12. The computer program according to claim 8, wherein said executing the mask data processing includes optical proximity correction.

13. The computer program according to claim 8, wherein the property data contains a plurality of property data for a pattern to be processed.

14. The computer program according to claim 8, wherein the property data is defined for each divided area of the chip.

15. A semiconductor device manufacturing method comprising:

preparing mask pattern data based on design pattern data, which comprises:

preparing a first database by allocating property data to predetermined positions assigned in a chip;

storing, by a processor, data regarding the allocating in the first database in a memory;

preparing a second database by pairing a cell name of a cell extracted from hierarchical processing of the design pattern data and arrangement positional data of the cell;

storing, by the processor, data regarding the pairing in the second database in the memory;

allocating property data to the cell based on the first database and the second database, and executing mask data processing based on at least one of the property data, to prepare for a rearrangement of the cell; and rearranging on the chip the cell subjected to the mask data processing;

preparing a mask based on the mask pattern data;

forming a predetermined film on a semiconductor wafer, followed by patterning the predetermined film through the mask by lithography to form wiring lines;

dicing the semiconductor wafer to form a plurality of chips;

mounting each of the plurality of chips on a predetermined package, wherein the property data contains at least one selected from the group consisting of an aberration of an exposure device, a property of an illumination, a property of a projection lens, and a pattern coverage in a shot.

16. The manufacturing method according to claim 15, wherein the property data further contains at least one selected from the group consisting of an illumination shape, an illumination brightness, an aberration of a projection lens, a transmittance of the projection lens, and a polarization degree of illumination.

17. The manufacturing method according to claim 15, further comprising calculating a finished plane shape on the semiconductor substrate which is predicted from the mask data processing, and correcting the design pattern based on a result of said calculating.

18. The manufacturing method according to claim 15, wherein said executing the mask data processing includes resizing processing.

19. The manufacturing method according to claim 15, wherein said executing the mask data processing includes optical proximity correction.

20. The manufacturing method according to claim 15, wherein the property data contains a plurality of property data for a pattern to be processed.

* * * * *